United States Patent
Itkin et al.

(10) Patent No.: US 7,538,609 B2
(45) Date of Patent: May 26, 2009

(54) AMPLIFIER, TRANSMITTER ARRANGEMENT HAVING AN AMPLIFIER AND METHOD FOR AMPLIFYING A SIGNAL

(75) Inventors: Grigory Itkin, München (DE); Andrei Grebennikov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 98 days.

(21) Appl. No.: 11/698,404

(22) Filed: Jan. 26, 2007

(65) Prior Publication Data

US 2008/0180168 A1    Jul. 31, 2008

(51) Int. Cl.
    *H03F 1/14*    (2006.01)
(52) U.S. Cl. .................... 330/51; 330/124 R
(58) Field of Classification Search .......... 330/51, 330/124 R
    See application file for complete search history.

(56) References Cited

U.S. PATENT DOCUMENTS

| 4,647,868 | A  | * | 3/1987  | Mueller ..................... 330/286 |
| 5,256,987 | A  | * | 10/1993 | Kibayashi et al. ........... 330/295 |
| 5,758,269 | A  |   | 5/1998  | Wu |
| 6,362,685 | B1 | * | 3/2002  | Vagher .................. 330/124 R |
| 6,954,623 | B2 |   | 10/2005 | Chang et al. |

* cited by examiner

*Primary Examiner*—Steven J Mottola
(74) *Attorney, Agent, or Firm*—Eschweiler & Associates, LLC

(57) ABSTRACT

An amplifier includes a signal input, a first, second and third amplification path. A coupling element having a first and a second output terminal is coupled to respective input terminals of the first and second amplification paths, and is coupled with a third terminal to an input terminal of the third amplification path. In a first mode of operation the coupling element provides a signal at the first and second output terminals, wherein the signal at the second output terminal comprising a phase shift with respect to the signal at the first output terminal. In a second mode of operation, the coupling element provides a signal at the third output terminal, wherein the provided signal is received at the input terminal and reflected on the first and second output terminals.

29 Claims, 4 Drawing Sheets

For a splitter

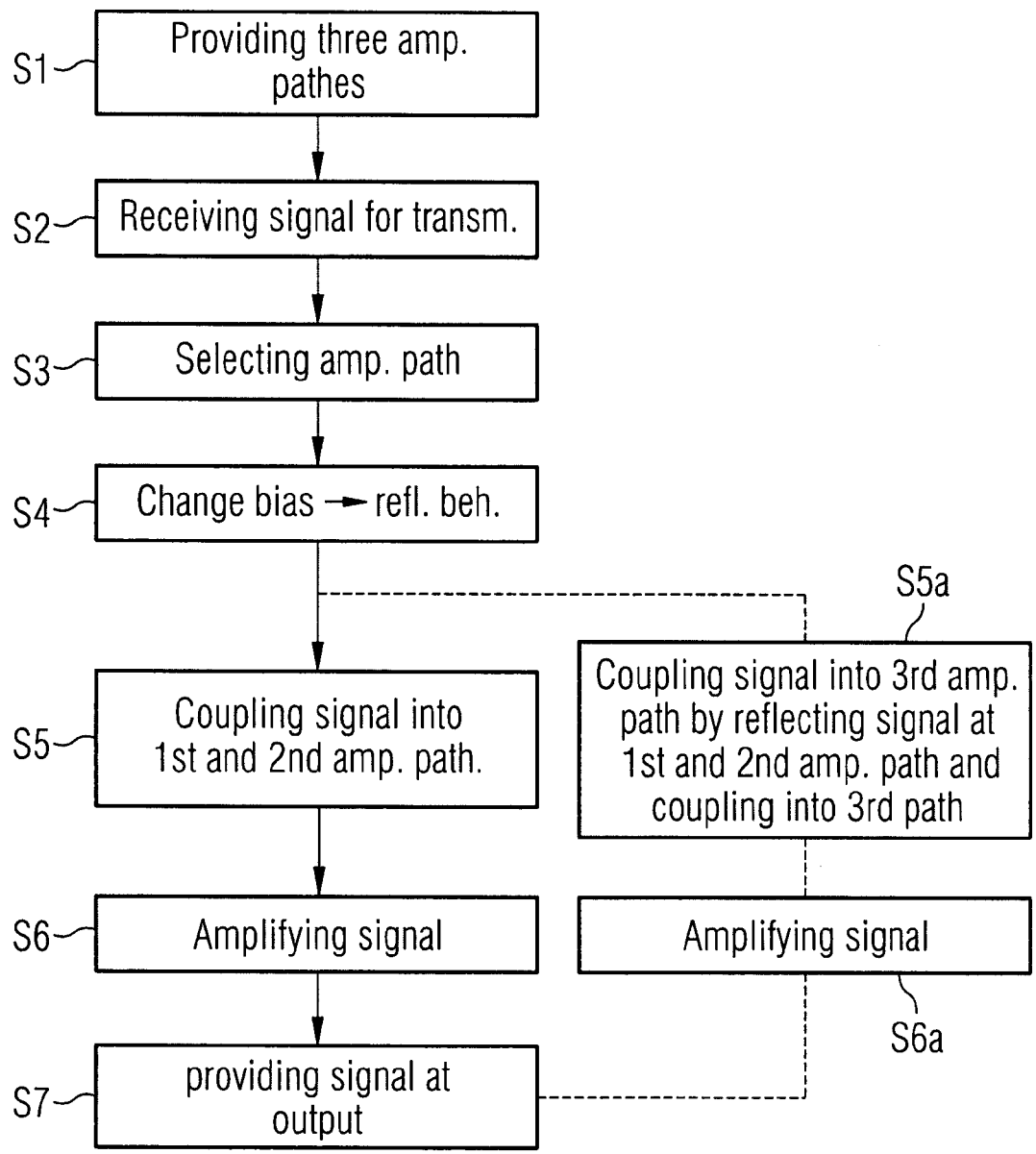

AMPLIFIER, TRANSMITTER ARRANGEMENT HAVING AN AMPLIFIER AND METHOD FOR AMPLIFYING A SIGNAL

FIELD OF THE INVENTION

The present invention relates to an amplifier and to a transmitter arrangement having an amplifier. The invention also refers to a method for amplifying a signal.

BACKGROUND OF THE INVENTION

In many communication systems, it is required that a power amplifier in a transmission path be able to operate with high efficiency and high linearity simultaneously. Due to the customer desires for different applications and communication standards, such as GSM/EDGE, CDMA2000, WCDMA or WLAN, the power amplifiers of the transmitter path have to deliver a wide range of different output powers. In addition, the different communication standards specify different maximum output powers which the power amplifier in the transmitter path has to deliver. For example the mobile communication standard GSM defines a maximum output power of about 36 dBm, while the maximum output power for a signal according to the WCDMA standard is about 30 dBm. These power levels are given with respect to front end insertion losses.

However, there is a tradeoff between efficiency in high power applications and linearity of the used amplifiers. Normally, a higher linearity in the used amplifier will result in a lower maximum output power and vice versa. As a result, being designed for the highest power level with maximum available efficiency, the power amplifier tends to operate less efficiently at low power levels. This will shorten the lifetime of the battery and reduce talk time duration.

It has been proposed to use different amplifier stages and switch those stages selectively into an amplification path with proper connection to the load. FIG. 4 shows a conventional configurable power amplifier for use in a portable unit. As one can see, the transmitter path comprises three different amplification stages, each of them individually selectable. Three different switches are provided, which connect the output terminals of the respective power amplifiers with the RF output terminal of the transmitter path. Consequently, in such configurable power amplifiers, where each stage has its own output configuration, the described transmitter path provides a variable output power level corresponding to the output powers of each stage and their combinations.

Nevertheless, there is a desire to further improve existing transmitter or amplifier arrangements to reduce power consumption.

BRIEF DESCRIPTION OF THE DRAWINGS

The invention is explained in detail below using exemplary embodiments with reference to the drawings in which FIG. 5 shows an embodiment of a method for amplifying a signal.

DETAILED DESCRIPTION OF THE INVENTION

Figure 1:
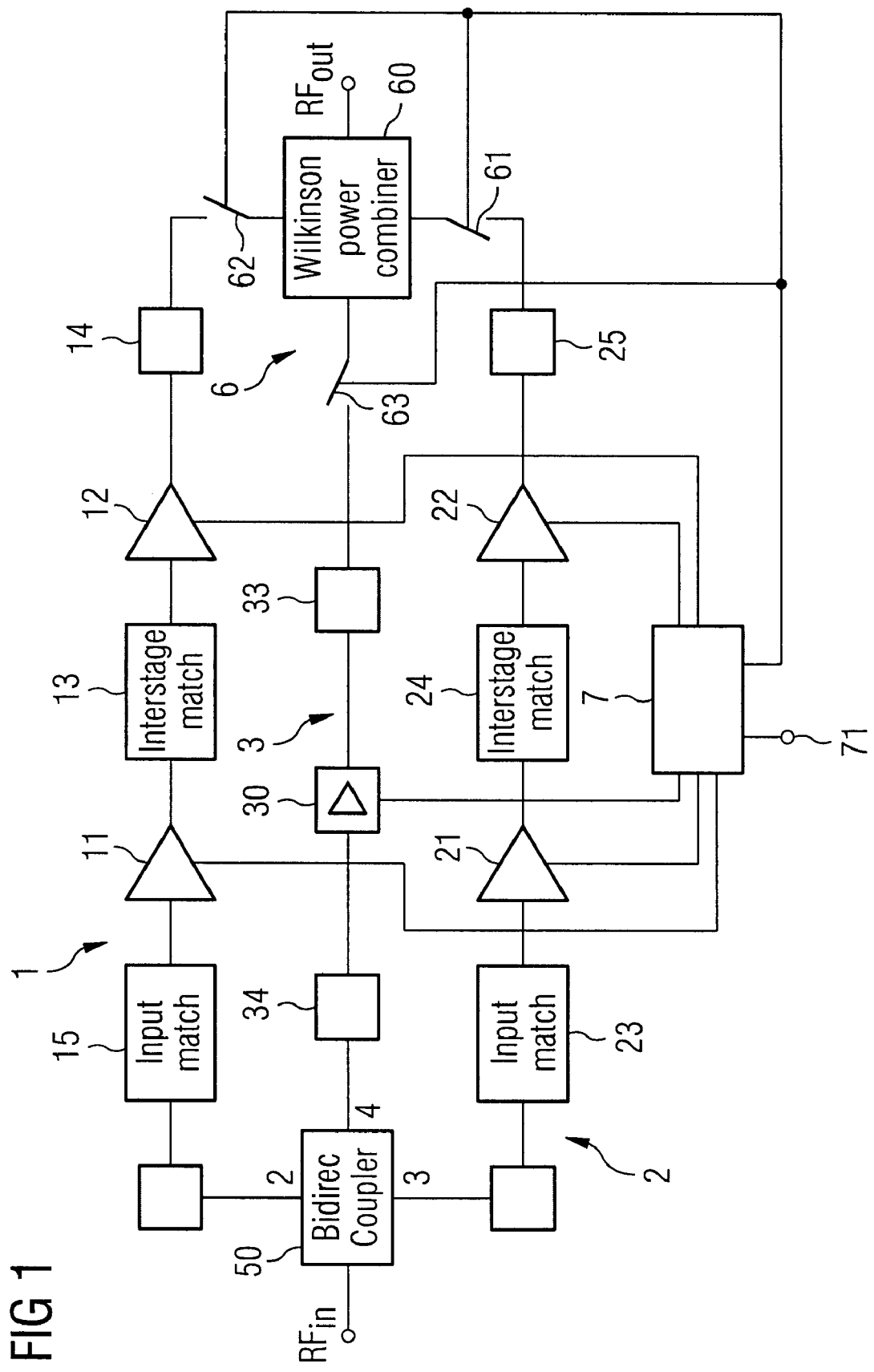
FIG. 1 shows a first exemplary embodiment of an amplifier arrangement according to several aspects of the present invention.

In the following description, further aspects and embodiments of the present invention are disclosed. In addition, reference is made to the accompanying drawings, which form a part hereof, and in which is shown by way of illustration, in which the invention may be practiced. The embodiments of the drawings present a discussion in order to provide a better understanding of one or more aspects of the present invention. The disclosure is not intended to limit the features or key elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawings are not necessarily to scale relative to each other. Like reference numerals designate corresponding similar parts.

In one exemplary embodiment, an amplifier arrangement comprises a signal input for an RF input signal and a first and second amplification signal path. Each of the first and second amplification signal paths comprises an output terminal, an input terminal, and at least one amplifier unit coupled to the input terminal. A third amplification signal path is provided, having an input terminal, at least one amplifier unit coupled to the input terminal, and an output terminal. In addition, a first coupling element is arranged, wherein the first coupling element has an input terminal coupled to the signal input, and first and second output terminals coupled to the input terminals of the respective first and second amplification signal paths. Further, a third terminal of the first coupling element is coupled to the input terminal of the third amplification signal path.

In a first mode of operation, the first coupling element is adapted to provide a signal received at its input terminal at the first output terminal and at the second output terminal. The signal at the second output terminal comprises a phase shift with respect to the signal at the first output terminal. In a second mode of operation, the first coupling element is adapted to provide a signal at the third output terminal. The signal provided at the third output terminal is received at the input terminal of the coupling element and reflected on the first and second output terminals of the coupling element.

In an embodiment of the invention an amplifier arrangement comprises an additional separate low power amplifying path connected between two ports of a coupling element. Depending on the mode of operation, the signal processing in the coupling element is different. In a first mode of operation, a signal at the input terminal of the coupling element is forwarded to the first and second output terminals including a phase shift between both signals at the output terminals. In the second mode of operation, a signal fed into the coupling element at the input terminal is reflected on the first and second output terminals to the third output terminal.

With the amplifier arrangement according to the embodiments, it is possible to select the first and second amplification signal paths or the third amplification signal path, respectively, without using any switches in the amplifier arrangement. This is achieved by using the reflection and transmission behavior of the coupling element at the first and second output terminals in an advantageous manner.

In a further embodiment, the first and second mode of operation can be selected by activating or deactivating the first and second amplification signal paths, respectively. Activation or deactivation can be achieved, for example, by actuating the first and second amplification signal paths, and any signal applied to the first input terminal of the coupling device is provided at the first and second output terminals. The activated first and second amplification signal paths receive the signals at the output terminals. Any reflection of signal portions at the first and second output terminals back to the third output terminal can be significantly reduced by matching the input impedance of the first and second amplification signal paths to the respective impedance of the output terminals.

When deactivating the first and second amplification signal paths, the input impedance of the amplification signal paths are different from the output impedance of the first and second output terminals of the coupling device. This results in a high reflection coefficient at the first and second output terminals, which causes any signal to be reflected back to the third output terminal.

In a further embodiment, the at least one amplifier of the first and second amplification signal paths may comprise a biasing input. The biasing input is adapted to receive a biasing signal. With use of the biasing signal, the at least one amplifier in the first and second amplification signal paths can be activated or deactivated. In another embodiment, the at least one amplifier of the third amplification signal path can also comprise a biasing input for receiving a biasing signal. By switching the biasing signal of at least one amplifier of the respective amplification signal paths, the first or second mode of operation can be selected.

In yet a further possible embodiment, the at least one amplifier of at least one of the amplification signal paths may comprise a gain control input for adjusting the amplification gain.

In a further embodiment, the amplifier arrangement may also comprise a signal output and a second coupling element coupled with its output terminal to the signal output. The second coupling element comprises a first and second input terminal coupled to the output terminals of the respective first and second amplification signal paths.

In another embodiment, three amplification signal paths may be arranged between a first and a second coupling element. The amplification signal paths may differ in their maximum output power. In a first mode of operation, the second coupling element provides a signal at its output terminal. That signal is derived from signals at its first and second input terminals. In the second mode of operation, the second coupling element provides a signal at its output terminal, wherein the signal is received at the third input terminal and reflected on the first and second input terminals back to the output terminal.

In such arrangement, it is possible to switch between different amplification signal paths without the use of signal switches. The switching can be achieved by selectively activating or deactivating the first and the second, or the third amplification signal paths.

In one embodiment, an amplifier arrangement comprises a signal output for an RF-signal, a first and second arrangement signal path, each having an output terminal, an input terminal and at least one amplifier component. The at least one amplifier component of each amplification signal path is coupled to that input and that output terminal. A third amplification signal path is provided. A coupling element has an output terminal coupled to the signal output, and a first and second input terminal coupled to the output terminals of the respective first and second amplification signal paths. A third terminal of the coupling element is coupled to the output terminal of the third amplification signal path. The amplifier arrangement comprises two possible modes of operation. In a first mode of operation, the coupling element is adapted to provide a signal at its output terminal. That signal is derived from signals at its first and second input terminals. In a second mode of operation, that coupling element is adapted to provide a signal at its output terminal, wherein the signal is received at the third input terminal and reflected on the first and second input terminals back to the first output terminal.

Such reflection can be achieved, for example, by activating or deactivating the first and second amplification signal paths, thereby changing the output impedance of the first and second amplification signal paths.

In one embodiment, at least one of the first, second and third amplification signal paths may comprise a matching circuit arranged between the output terminals of the first coupling element and the at least one amplifier component. A matching network element can also be arranged between the input terminal of the second coupling element and the at least one amplifier component. The matching circuit is adapted to match the output impedance of the respective amplifier to the input impedance of the second coupling element. In another embodiment, the matching circuit is adapted to match the output impedance of the first coupling element to the input impedance of the respective amplifier component of the amplification signal path connected to the output terminal.

FIG. 1 shows an embodiment of an amplifier arrangement having a coupling element 50 connected to the signal input $RF_{in}$. The coupling element 50 comprises a directional coupler. Directional couplers are passive devices used in the field of radio technology. The coupler 50 couples a known portion of the RF input signal out through the other ports, namely through ports 2' and 3'. The fourth port resembling the output terminal 4' is often called the isolated port. In this embodiment, the first output terminal corresponding to the second port 2' is connected to an input matching network 15 of the first amplification signal path 1. The first amplification signal path also comprises an amplifier stage 11, connected to the input matching network 15, an inter-stage matching network 13 arranged between the output of the amplifier stage 11 and an input terminal of a second amplifier stage 12. The output of the second amplifier stage 12 is coupled to an output matching network 14 which in turn is connected to a switching unit 62. Correspondingly, the second amplification signal path 2 comprises the same elements.

Those stages 11 and 12 may comprise single amplifier components, amplifier devices or amplifier units. The stage can also comprise a plurality of single amplifier components or amplifier subunits. The amplifier according to the invention can be realized in a semiconductor material as integrated circuit, but also realized with some discrete elements. For example in one embodiment each amplification path is realized as an integrated circuit.

The matching networks 15 and 23, 13 and 24, 14 and 25, respectively, improve the linearity of different values of load voltage standing wave ratio (VSWR) compared to a conventional single-ended prototype. The output terminal 4' of the directional coupler 50 is connected to a third amplification signal path. The third amplification signal path 3 comprises a matching network 34 coupled to an amplifier stage 30. The output of the amplifier stage is coupled via an output matching network 33 to the switching element 63.

In this embodiment, the transmitter path for high output power is provided by the first and second amplification signal paths 1 and 2. The third amplification signal path 3 is used for output low power RF-signals. For further adjustment of the output power, the amplifier arrangement according to the embodiment of FIG. 1 comprises a control circuit 7 which is connected to the respective biasing inputs of each of the amplifier stages in the amplification signal paths. Finally, the switching elements 61, 62, and 63 of the respective amplification signal paths are connected to a power combiner 60 (for example, a Wilkinson combiner) coupled to the signal output $RF_{out}$.

In operation, the desired output power can be adjusted by the control circuit 7. The control circuit 7 receives a control word via the control input 71 and sets the amplifier of each of the amplification signal paths to the desired biasing values. For example, if a low output power is needed, the third amplification signal path 3 will be activated. Consequently, the control circuit 7 closes the switch 63 to connect the third amplification signal path 3 to the power combiner 60. Further, the amplifier stages 11, 12, 21, and 22 are deactivated by switching off the biasing current. At the same time, the switches 61 and 62 are opened.

As will be explained below, the deactivation of the amplifiers deactivates the first and second amplification signal paths. At the same time, the matching network 34 matches the input impedance of the now biased amplifier 30 to the output 4' of the directional coupler 50. The activation of the third amplification signal path by biasing the amplifier 30 significantly reduces the reflection coefficient of the output port 4' of coupler 50. At the same time, the reflection coefficients at ports 2' and 3' are significantly increased due to the deactivation of the amplification signal paths 1 and 2. As a result, any RF-signal at the signal input coupled into the directional coupler 50 is reflected at the output terminals 2' and 3' of the coupler 50 and forwarded to output terminal 4'.

If high output power is needed, the control circuit 7 deactivates the third amplification signal path 3 by switching off amplifier 30, thereby switching the input impedance of amplifier 30. Due to the change in the impedance, the matching network 34 is not capable of matching the input impedance of amplifier 30 to the output impedance of terminal 4' of coupler 50. Consequently, the reflection coefficient at port 4' increases significantly and the terminal 4' now behaves like an isolated port. Switch 63 will be opened while switches 61 and 62 will be closed by control circuit 7.

The amplifier stages 11, 12, 21, and 22 are activated and biased by the control circuit 7. The input matching networks 15 and 23 are matching the output impedance of the respective output terminals of coupler 50 to the input impedance of amplifier stages 11 and 21. As a result, the reflection coefficients at the output terminals are decreased and a signal coupled into the coupler 50 is forwarded to output terminals 2' and 3'. After amplification in the amplification signal paths, both signals are combined in combiner 60 and provided at the signal output $RF_{out}$.

Figure 2:
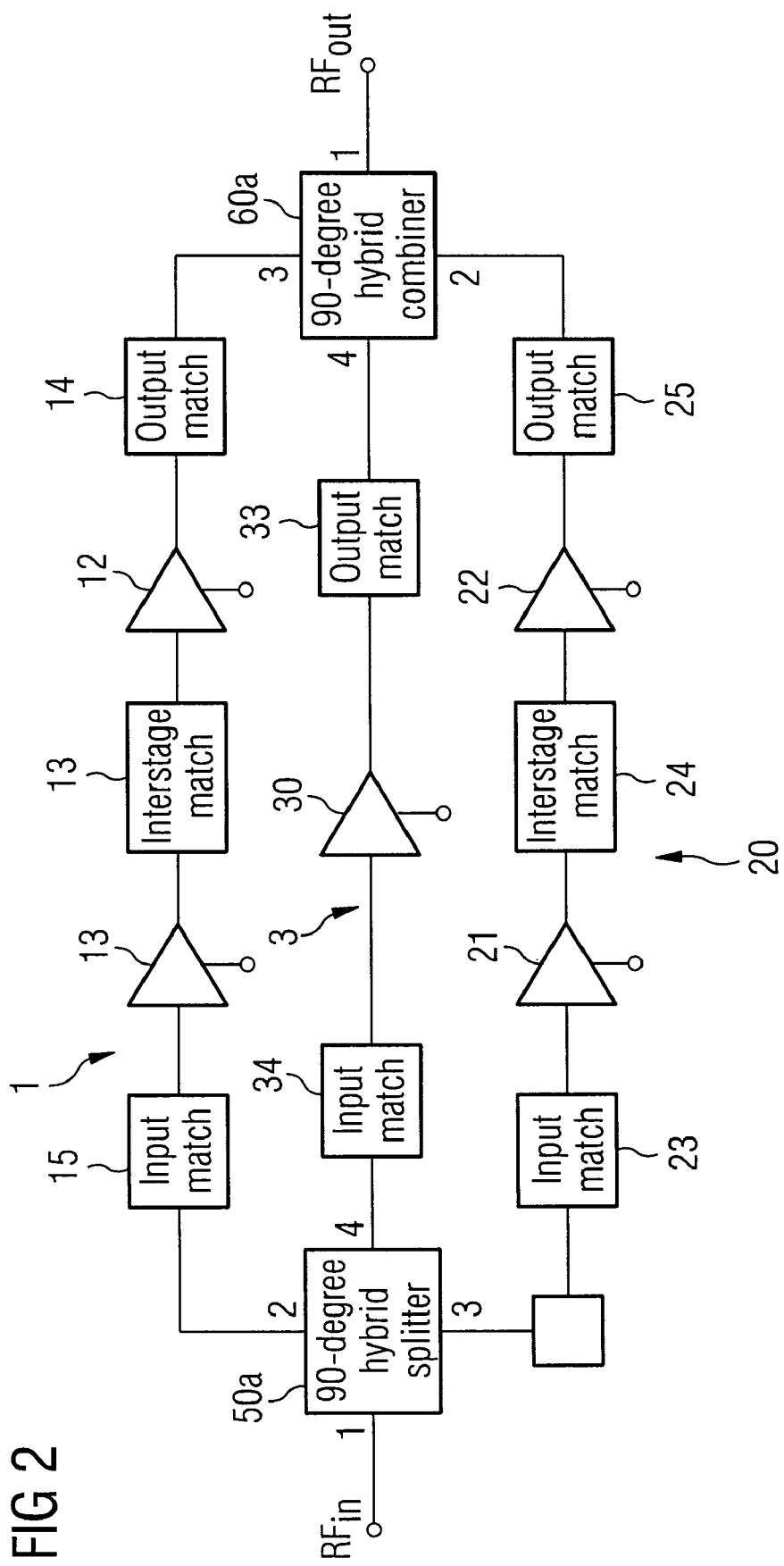
FIG. 2 shows a second exemplary embodiment of the amplifier arrangement according to the present invention.

FIG. 2 shows another embodiment for an amplifier arrangement. The arrangement comprises first and second amplification signal paths, each comprising an input matching network, two adjustable amplifiers, an inter-stage matching network in-between the amplifiers, and an output matching network. The amplification signal paths 1 and 2 are arranged between two coupling elements 50a and 60a, respectively. The coupling element 50a comprises a 90° hybrid splitter, while the element 60a is a 90° hybrid combiner. The amplifier arrangement further comprises an additional separate low power amplifying path 3 connected between the isolated port 4' of the input hybrid splitter 50a and the isolated port 4' of the output hybrid combiner 60a.

Figure 3:
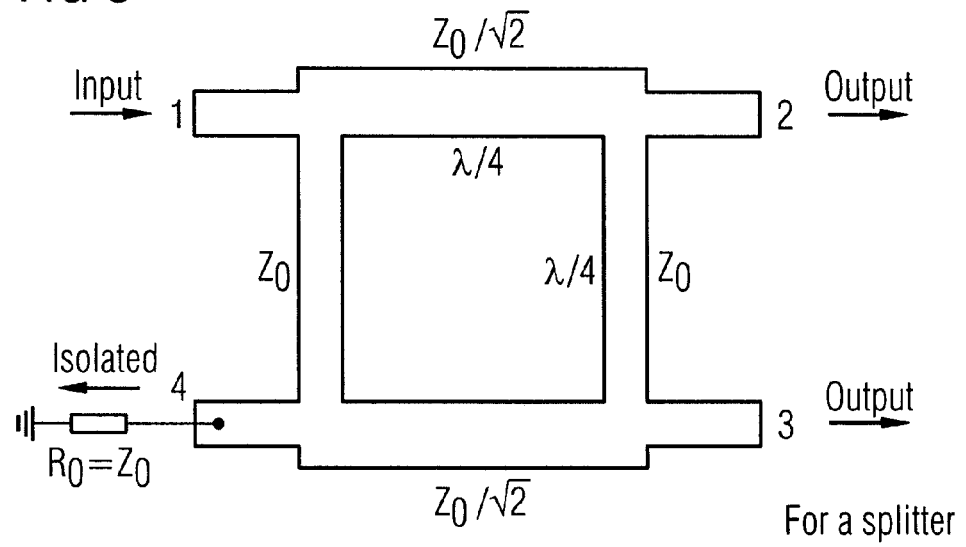
FIG. 3 shows an embodiment of a 90° hybrid splitter.
Figure 4:
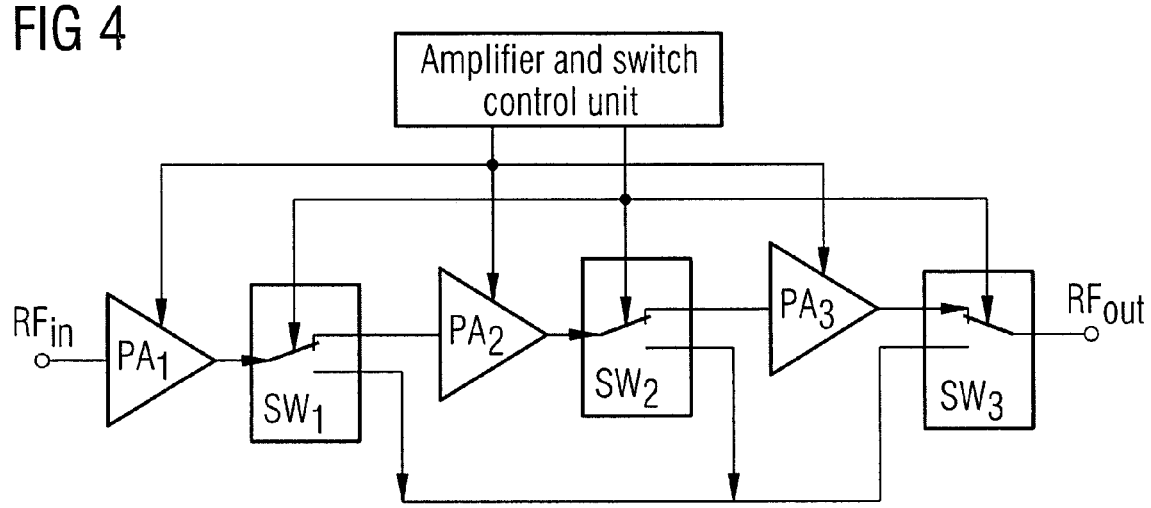
FIG. 4 shows an amplifier arrangement of a known transmitter path.

FIG. 3 shows one exemplary possible embodiment of such 90° hybrid splitter. For realizing the 90° hybrid combiner 60a, the RF signal direction, namely input and output direction, can be reverted because the 90° hybrid splitter shown herein is a linear device. The hybrid splitter in one embodiment comprises two transmission lines with impedance $Z_0/\sqrt{2}$ set close enough together such that energy passing through one is coupled to the other. The length of the transmission lines between the input port 1, the output port 2, the isolated port 4 and the output port 3 is set to $\lambda/4$, wherein $\lambda$ corresponds to the wavelength of the transmitted RF signal. A signal entering input terminal 1 is divided in its power between the output terminals 2 and 3 equally, but includes a 90° phase shift between these output terminals. No power is delivered to the isolated terminal 4 due to the low reflection coefficients.

In other words, the incoming signal at input port 1' is split and two signals are provided at output ports 2' and 3'. The signal at output port 2' comprises the same frequency and phase as the signal at the input port 1' while the signal at terminal 3' comprises the same frequency as the signal at input port 1' but a phase shift of 90° in respect to the signal delivered to the output port 2'. The isolated output port 4' stays isolated as long as the impedance $Z_0$ is equal to $R_0$, which is the case if the reflection coefficients at the output ports 2' and 3' do not increase significantly.

In a different embodiment of a hybrid splitter, the splitter may be adopted to cause a phase shift of +45° at output port 2' and −45° at output port 3' in respect to a phase of a signal at input port 1'. In other words, a signal at input port 1' having a frequency and a first phase is provided at output port 2' with a phase shift of +45° in respect to the first phase and at output port 3' with a phase shift of −45° in respect to the first phase. If the high power amplification signal paths 1 and 2 are activated, the input matching networks 15 and 23 are matching the input impedance of amplifiers 13 and 21 to the output impedance of output terminals 2' and 3' of the hybrid splitter 50a. Correspondingly, the output matching networks 15 and 25 are matching the impedance of amplifiers 12, 22 to the input terminals 2' and 3' of the hybrid combiner 60a. The terminals 4' of the splitter 50a and combiner 60a will remain isolated.

In low power mode, a bias control unit not shown herein switches off the biasing of the transistors in both balanced amplifiers paths 1 and 2 and provides proper biasing for the low power amplifying path 3. A signal at the input terminal 1' of the hybrid splitter 50a is now reflected at the output terminals 2' and 3' back to the isolated port 4'. Due to the activation of amplifier 30 and the input matching network 34, the output terminal 4' becomes transparent and the signal reflected to the isolated port is forwarded to amplification signal path 3.

The quadrature hybrid as shown herein is advantageous in one embodiment because any input voltage standing wave ratio of such hybrid does not depend on the equal load mismatching level. Therefore, all reflected power flows into terminal 4' and is dissipated in the resistor, namely the third amplification signal path 3. Similarly, for a combiner, the reflection wave from the two inputs 2' and 3' will flow to the load and are provided at the signal output $RF_{out}$. As a result, the output terminals 4', normally called isolated port 4', works as 50Ω output or 50Ω input, respectively.

The different amplifier arrangements shown herein provide a very high efficiency even at lower output levels without including any additional switches to isolate the high power amplification signal paths 1 and 2 from the lower amplification signal path. Additionally, adaptive biasing can be applied to transistors in the amplification signal path 3 to minimize quiescent currents at very low output powers. This adaptive biasing contributes to an increase an efficiency of approximately 200-300% compared to the conventional balance architecture.

In one embodiment the hybrid splitter 50a as well as the hybrid combiner 60a or the directional coupler 50 generally can be implemented with any lumped or transmission line elements. These can be, for example, discrete elements like coils having an inductance L or capacitors with capacitance C. The number of power amplifiers within the amplification paths 1 to 3 may change and can be adapted to the specific needs.

FIG. 5 shows different steps of a method for amplifying a signal. While the exemplary method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

With the method of FIG. 5 it is possible to amplify a signal by use of different amplification paths without the need of providing switches to select or deselect the desired path. After providing at least three amplification paths at S1, the signal for transmission, which is to be amplified is provided at S2. The amplification path used for amplification of the provided signal is now selected at S3. For such selection the reflection behavior and the impedance, respectively, of the amplification paths are utilized. For all amplification paths which are not selected for amplification, the reflection coefficient is set to a high value at S4. Consequently, the reflection coefficient of the selected path is set to a low value. As a result, any signal applied to an input terminal of the unselected amplification path(s) is reflected, while at the selected path, a signal is fed into the path and can be amplified at S5. It is possible to utilize the impedance of the amplification paths as well in one embodiment. Further, the amplifier stage biases may be set at S4 while the amplifier stages in unselected paths may be turned off via biasing, for example.

If two paths are selected, the signal is applied to the paths and will be amplified. After amplification in the selected paths at 6 and 6*a*, respectively, the amplified signal is provided at an output terminal at S7.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

The Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

What we claim is:

1. An amplifier, comprising:
   first and second amplification signal paths;
   a third amplification signal path;
   a first coupling element comprising first and second output terminals coupled to respective input terminals of the first and second amplification signal paths, and a third output terminal coupled to an input terminal of the third amplification signal path;
   wherein in a first mode of operation the first coupling element is adapted to provide a signal at the first output terminal and at the second output terminal, the signal at the second output terminal comprising a phase shift with respect to the signal at the first output terminal; and
   wherein in a second mode of operation, the first coupling element is adapted to provide a signal at the third output terminal, the provided signal being received at an input terminal of the coupling element and reflected on the first and second output terminals.

2. The amplifier of claim 1, wherein the first mode of operation is selectable by activating the first and second amplification signal paths and deactivating the third amplification signal path.

3. The amplifier of claim 1, wherein the second mode of operation is selectable by activating the third amplification signal path and deactivating the first and second amplification signal paths.

4. The amplifier of claim 1, further comprising at least one first amplifier unit arranged in each of the first and second amplification signal paths, wherein the first amplifier unit comprises a biasing input terminal to receive a biasing signal.

5. The amplifier of claim 4, further comprising at least one second amplifier unit arranged in the third amplification signal path, wherein the second amplifier unit comprises a biasing input to receive a biasing signal.

6. The amplifier of claim 5, wherein the biasing inputs comprise gain control inputs to adjust the amplification gain.

7. The amplifier of claim 5, further comprising a control circuit comprising a control input terminal configured to receive a power control word, and an output terminal coupled to the biasing inputs of the first and second amplifier units.

8. The amplifier of claim 1, further comprising:
   a signal output;
   a second coupling element comprising an output terminal coupled to the signal output, first and second input terminals coupled to respective output terminals of the first and second amplification signal paths, and a third terminal coupled to an output terminal of the third amplification signal path;
   wherein in the first mode of operation the second coupling element is adapted to provide a signal at its output terminal, wherein the signal is derived from signals at the first and second input terminals; and
   wherein in the second mode of operation the second coupling element is adapted to provide a signal at its output terminal, wherein the provided signal is received at the third input terminal and reflected on the first and second input terminals.

9. The amplifier of claim 1, wherein the first coupling element comprises a 90° hybrid splitter or a bi-directional coupler.

10. The amplifier of claim 9, wherein the 90° hybrid splitter comprises an input terminal and a transmission line having a length of ¼ of a center wavelength of the signal at the input terminal.

11. The amplifier of claim 1, wherein at least one of the first, second and third amplification signal paths comprises a matching circuit, arranged between the output terminal of the coupling element and the respective at least one amplifier unit, wherein the matching circuit is adapted to match the output impedance of the coupling element to an input impedance of the respective amplifier unit.

12. An amplifier, comprising:

a first and a second amplification signal path;

a third amplification signal path;

a coupling element comprising first and second input terminals coupled to respective output terminals of the first and second amplification signal paths, and a third input terminal coupled to an output terminal of the third amplification signal path; and wherein in a first mode of operation the coupling element is adapted to provide a signal at an output terminal, wherein the signal is derived from signals at its first and second input terminals, and in a second mode of operation the coupling element is adapted to provide a signal at its output terminal, wherein the signal is received at the third input terminal and reflected on the first and second input terminals;

and wherein the first and second mode of operation is adjustable by activating or deactivating the first and second amplification signal paths by selectively biasing an amplifier unit in each of the first and second amplification signal paths, resulting in an impedance change at the input terminals thereof.

13. The amplifier of claim 12, further comprising at least one first amplifier device arranged in each of the first and second amplification signal paths, wherein the first amplifier device comprises a biasing input configured to receive a biasing signal.

14. The amplifier of claim 13, further comprising at least one second amplifier device arranged in the third amplification signal path, wherein the second amplifier device comprises a biasing input configured to receive a biasing signal.

15. The amplifier of claim 14, wherein the biasing inputs comprise gain control inputs to adjust the amplification gain.

16. The amplifier of claim 14, further comprising a control circuit comprising an input terminal for receiving a control word and at least one output terminal coupled to the biasing input terminals of at least one of the first and second amplifier devices.

17. The amplifier of claim 12, wherein the coupling element comprises a 90° hybrid combiner or a bi-directional coupler.

18. The amplifier of claim 12, wherein at least one of the first, second and third amplification signal paths comprises a matching circuit, arranged between an output terminal and the respective at least one amplifier device of the at least one amplification path, wherein the matching circuit is adapted to match the output impedance of the respective amplifier component to the input impedance of the coupling element.

19. A transmitter arrangement, comprising:

two amplification signal paths, each amplification signal path comprising an input terminal and an output terminal;

a third amplification signal path comprising an input terminal and an output terminal;

wherein the amplification signal paths each comprise a switchable impedance at the input terminals thereof, the switchable impedance selectable by biasing an amplifier unit in each of the amplification signal paths; and a power splitter device coupled to the input terminals of the amplification signal paths, wherein the power splitter device is adapted to route a signal to both the two amplification signal paths, or alternatively to the third amplification signal path in dependence on the input impedance of the amplification signal paths.

20. The transmitter arrangement of claim 19, wherein each of the two amplification signal paths comprise a matching network device arranged between the respective input terminals and an amplifier unit, wherein each matching network is adapted to match an input impedance of the amplifier unit to an impedance of the output terminal of the power splitter coupled to the respective amplification signal path.

21. The transmitter arrangement of claim 20, further comprising a control circuit having a control input terminal to receive a control word, and a signal output terminal coupled to the amplifiers of the amplification signal paths for biasing the at least one amplifier unit.

22. The transmitter arrangement of claim 19, further comprising:

a signal output for an RF signal; and a power combiner device having three input terminals coupled to the respective amplification signal paths and an output terminal connected to the signal output, therein the power combiner device is adapted to route a signal of at least one of the three amplification signal paths to the signal output based on the output impedance of the amplification signal paths.

23. The transmitter arrangement of claim 22, wherein the first power splitter device comprises a 90° hybrid splitter.

24. The transmitter arrangement of claim 22, wherein the power combiner device comprises a 90° hybrid combiner.

25. A method of amplifying a signal, comprising:

receiving a signal to be amplified;

selecting at least one of at least three amplification signal paths by changing the reflection behavior of the at least three amplification signal paths, wherein each of the amplification signal paths have at least one amplifier stage, and wherein the amplification signal paths are coupled to at least one coupling element;

coupling the signal to be amplified to the at least one selected amplification signal path, wherein coupling the amplification signal paths to the at least one coupling element comprises:

dividing the signal to be amplified into a first and a second signal portion;

providing the first signal portion at a first output connected to a first amplification signal path; and providing the second signal portion at a second output connected to a second amplification signal path, wherein the second signal portion comprises a phase shift with respect to the first signal portion; and amplifying the signal to be amplified by the at least one selected amplification path.

26. The method of claim 25, wherein changing the reflection behavior comprises biasing the amplifier stages, thereby changing the input impedance and output impedance of the respective amplification signal paths.

27. The method of claim 25, wherein coupling the signal to the at least one selected amplification signal paths comprises reflecting the signal to be amplified at two output terminals of the coupling device towards a third output terminal of the coupling device.

28. The amplifier of claim 12, wherein the signal at the second input terminal comprises a phase shift with respect to the signal at the first input terminal.

29. The transmitter arrangement of claim 19, wherein the first amplification path transmits a first signal and the second amplification path transmits a second signal, wherein the first signal comprises phase shift with respect to the second signal.

* * * * *